Sept. 25, 1973 J. E. HARLOW III, ETAL 3,761,327
PLANAR SILICON GATE MOS PROCESS
Filed March 19, 1971
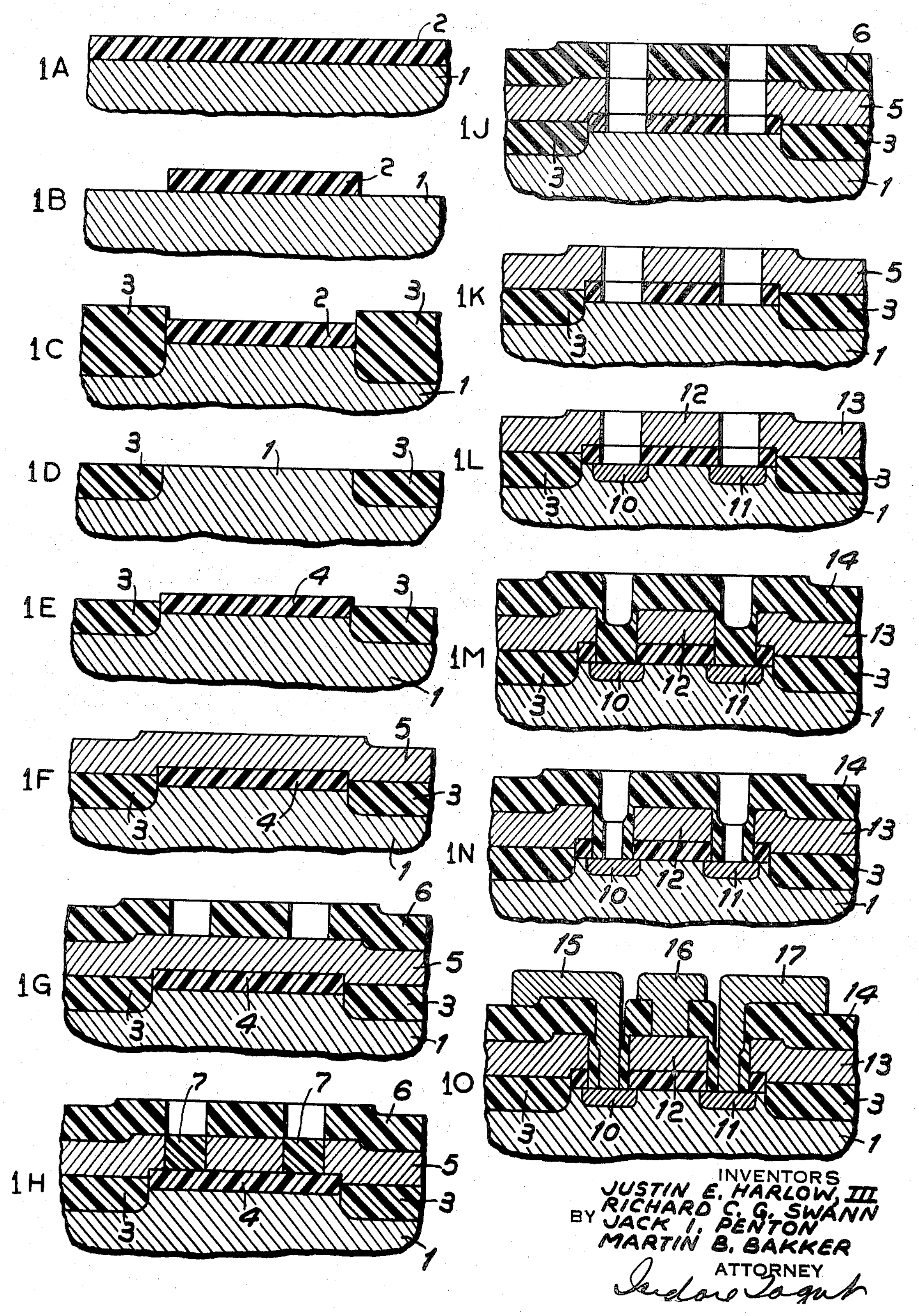
1A, 1B, 1C, 1D, 1E, 1F, 1G, 1H, 1J, 1K, 1L, 1M, 1N, 1O
INVENTORS
JUSTIN E. HARLOW, III
RICHARD C. G. SWANN
JACK I. PENTON
MARTIN B. BAKKER
BY [signature]
ATTORNEY

United States Patent Office 3,761,327
Patented Sept. 25, 1973

3,761,327

PLANAR SILICON GATE MOS PROCESS

Justin E. Harlow III, West Palm Beach, Richard C. G. Swann, North Palm Beach, Jack I. Penton, West Palm Beach, and Martin B. Bakker, Palm Beach Gardens, Fla., assignors to International Telephone and Telegraph Corporation, Nutley, N.J.

Filed Mar. 19, 1971, Ser. No. 126,025
Int. Cl. H01l *7/34*
U.S. Cl. 148—187 8 Claims

ABSTRACT OF THE DISCLOSURE

This invention refers to a method of manufacturing a metal insulator semiconductor field effect transistor having a source, drain and channel region and a gate formed over the channel region. There is formed a first insulating layer on a semiconductor substrate covering the non-active regions of the transistor and then a second insulating layer is formed over the active region of the transistor. A semiconductive layer is deposited over the active and non-active regions and subsequently the gate periphery of the semiconductor layer is converted to an oxide which is subsequently etched away thus exposing the source and drain regions of the transistor and the remainder of the gate periphery to the substrate surface. The gate and source and drain regions are then diffused with a doping impurity and metal contacts are deposited to the source and drain regions and to the gate semiconductor.

BACKGROUND OF THE INVENTION

This invention relates to a method of manufacturing a metal insulator semiconductor field effect transistor having a source, drain and channel region and a gate formed over the channel region. It has been found that by fabricating metal insulated semiconductor integrated circuit field effect transistors using silicon gate technology, that is, substituting polycrystalline silicon to overlie the gate insulator for previously used aluminum, there is a dramatic reduction in threshold voltage $V_T$ (that voltage necessary to be applied to the gate electrode so as to turn the device on) over previous devices which use an aluminum electrode to overlie the gate insulator. In conventional silicon gate technology as described by J. C. Sarace et al. in an article entitled "Metal-Nitride-Oxide Field Effect Transistor With Self-Aligned Gate," Solid State Electronics, vol. 11, 1968, p. 653 and later in "Electronics," Sept. 29, 1969, on pp. 88–94, the field structure or non-active regions are fabricated first and then the regions are defined for the MOS source, drain and gate. As disclosed in the copending application entitled "Silicon Insulated Gate Field Effect Transistor With Ground Plane," inventors R. C. G. Swann-J. I. Penton-A. R. Ramde, filed Apr. 16, 1971, Ser. No. 134,599, and assigned to the assignee of this invention, now abandoned, it has been found that it is possible to fabricate the gate and most of the field structure simultaneously and thus realize many advantages. A thinner insulator is secured and the metal strips are easier to fabricate. The polycrystalline silicon remains in the field region and is used as a ground plane to avoid the field inversion. All the polycrystalline silicon is in one plane and not in two planes as in the conventional process.

In this invention, these conditions are realized. An additional improvement in this invention is that the method described herein allows for a thickness in the overall step height of the semiconductor device topography as well as maintaining a relatively simple process with not more than four photomasking operations as used in our present technology. Additionally, the method of this invention allows the oxidation of polycrystalline silicon in selective regions to ultimately define the MOS gate patterns. The selectively oxidized polycrystalline silicon will be removed to allow source and drain diffusions and will also expose a previously formed layer of $SiO_2$ which serves as a diffusion mask in the areas outside of the source-drain region. Additionally, the process lends itself to both P and N channel processing.

SUMMARY OF THE INVENTION

It is an object of this invention to obtain an improved method of making an MIS IC FET which has a silicon ground plane in the field thus removing the necessity for a thick insulator and stabilization.

According to the invention, there is provided a method of manufacturing a metal insulator semiconductor field effect transistor having a source, drain and channel region and a gate formed over the channel region comprising the steps of forming a first insulating layer on a semiconductor substrate covering the non-active regions of the transistor, forming a second insulating layer over the active region of the transistor and then depositing a semiconductor layer over the active and non-active regions. The gate periphery of the semiconductive layer is now converted to an oxide and this oxide is then etched away exposing the source and drain regions of the transistor and the remainder of the gate periphery to the substrate surface. In fabricating P-channel devices the oxygen diffusion mask is removed, exposing the polycrystalline gates and ground plane. There is now diffused in the ground plane, gate, source and drain region a doping impurity to form said regions and finally, metal contacts are deposited to the source and drain regions and to the gate semiconductor.

BRIEF DESCRIPTION OF THE DRAWINGS

In the drawing, FIGS. 1A to 10 shows the various steps of one embodiment in forming a device according to the teachings of this invention.

DESCRIPTION OF THE INVENTION

With reference to FIG. 1A, there is shown a starting silicon substrate 1 to N type conductivity and having a resistivity of four ohm-cm. which may be typically 10 to 12 mils thick, 1¼ inch diameter wafer, the wafer having a <111> crystalline orientation.

A silicon nitride layer 2 is formed on the substrate 1. The silicon nitride may be formed from a mixture of silane ($SiH_4$) and ammonia ($NH_3$) and using standard electrodeless glow discharge techniques at approximately 400° C. until a thickness of about 3,000 A. is formed. The coverage of the silicon nitride layer 2 is reduced by standard masking photolithographic and etching techniques to what will be the active region of the transistor, FIG. 1B. Then a layer of silicon dioxide 3 is formed using steam oxidation to a growth of 10,000 A.; the silicon dioxide extends approximately 1,500 A. above the nitride and about 4,500 A. above the silicon level as shown in FIG. 1C. Now the 4,500 A. thick portion of layer 3 is etched away by the use of buffered HF and the remainder of the silicon nitride layer 2 is removed with phosphoric acid or RF glow discharge gas etch in $CF_4$ making the surface of the substrate completely planar as shown in FIG. 1D.

Referring to FIG. 1E, a thermal gate oxide 4 to a thickness of 1,200 A. is grown in the region formerly occupied by the silicon nitride as shown in FIG. 1B. Now as shown in FIG. 1F, there is pyrolitically deposited a polycrystalline silicon layer 5 in thickness ranging from 2,000 to 5,000 A., from an atmosphere containing 2% silane in nitrogen and a carrier gas such as hydrogen at a temperature of approximately 680° C.

Referring to FIG. 1G, there is deposited over the polysilicon layer 5 a layer of silicon nitride 6 approximately 3,000 A. thick from $SiH_4/NH_3$ and then the gate and ground plane regions of the device are delineated by removing silicon nitride from the gate periphery only.

As shown in FIG. 1H, the exposed regions of the polysilicon 5 are converted by steam oxidation at 1200° C. to silicon dioxide 7 and then this converted polysilicon is etched away to remove the original polysilicon and to come down to the silicon mesa level of the original substrate 1 as shown in FIG. 1J.

The next step shown in FIG. 1K is to remove all the silicon nitride layer 6 and thereby expose the remainder of the polycrystalline silicon layer 5. The wafer is then subjected to a boron diffusion of $BCl_3$ at 1030° C. to form the source 10, drain 11 and the P doped polysilicon gate 12 and ground plane 13 as shown in FIG. 1L. This process so far will produce a P channel device. While the channel region which defines the gate and through which the source and drain regions are diffused is a continuous channel, the source and drain regions are electrically isolated since the channel extends in a parallel manner along two regions of the mesa in substrate 1 and joins, forming a closed loop, over region 3 on opposite sides of the mesa region. If it is desired to produce an N channel device, then the boron diffusion step for the polycrystalline silicon gate and ground plane would be carried out before gate patterning. These regions would then be protected during the subsequent phosphorus diffusion ($POCl_3$ at 1080° C.) of source and drains in the P type substrate.

Now as shown in FIG. 1M, there is deposited a silicon dioxide layer 14 known as Silox which is formed over the polysilicon in a well-known manner using silane and oxygen at approximately 455° C. to a thickness of approximately 7,000 A. to serve as an intermetal dielectric and contact window mask. The device is then masked to define the contact hole pattern in the source, drain and gate and the silicon oxide layer 14 is etched in buffered HF to the single crystal silicon source and drain and polycrystalline silicon in gate contacts (FIG. 1N) and finally, metallic contacts are deposited, such as aluminum, to a thickness of 10,000 A. as shown in FIG. 1O. For further protection, glass passivation may be used according to well-known techniques.

It is to be understood that the foregoing description of a specific example of this invention is made by way of example only and is not to be considered as a limitation on the scope of the claims.

We claim:

1. A method of manufacturing a metal insulator semiconductor field effect transistor having source, drain and channel regions and a gate formed over said channel region, comprising the steps of:

forming a first insulating layer on a semiconductor substrate over the non-active regions of said transistor;
forming a second insulating layer over the acting regions of said transistor;

depositing a semiconductive layer over said active and non-active regions;
converting portions of said semiconductive layer to an oxide, said portion defining the periphery of said gate;
exposing the source and drain regions of said transistor and the remainder of the gate periphery to the substrate surface;
diffusing doping impurities in the exposed area to form said source and drain regions; and
forming ohmic contacts to said source and drain regions and to said gate.

2. A method of manufacturing a metal insulator semiconductor field effect transistor according to claim 1, wherein said substrate is silicon and said first insulating layer is approximately 10,000 A. thick silicon dioxide.

3. A method according to claim 2, wherein said second insulating layer is dry thermal silicon dioxide 1,200 A. thick.

4. A method according to claim 3, wherein said semiconductive layer is polysilicon.

5. A method according to claim 4, wherein said substrate is N type conductivity and said source and drain regions and said polysilicon layer are doped with boron to form a P channel transistor.

6. A method according to claim 5, wherein said substrate is P type conductivity, said source and drain regions are doped with phosphorus to produce N type conductivity and said polysilicon layer is P type conductivity.

7. A method according to claim 6, wherein prior to the forming of said first insulating layer and said second insulating layer, there is formed a layer of silicon nitride over the whole surface of said substrate and subsequently all of said silicon nitride is removed except for that portion covering the active region of said transistor.

8. A method according to claim 7, wherein prior to the forming of said second insulating layer the silicon nitride covering the active region is removed.

References Cited

UNITED STATES PATENTS

| | | | |
|---|---|---|---|
| 3,544,399 | 12/1970 | Dill | 148—187 |
| 3,460,007 | 8/1969 | Scott, Jr. | 317—235 |
| 3,534,234 | 10/1970 | Clevenger | 148—186 X |
| 3,566,518 | 3/1971 | Brown et al. | 29—571 |

L. DEWAYNE RUTLEDGE, Primary Examiner

J. M. DAVIS, Assistant Examiner

U.S. Cl. X.R.

317—235 R